(12) United States Patent
Anderson

(10) Patent No.: US 6,414,338 B1
(45) Date of Patent: Jul. 2, 2002

(54) N-TYPE DIAMOND AND METHOD FOR PRODUCING SAME

(75) Inventor: Richard J. Anderson, Oakland, CA (US)

(73) Assignee: Sandia National Laboratories, Livermore, CA (US)

(*) Notice: Subject to any disclaimer, the term of this patent is extended or adjusted under 35 U.S.C. 154(b) by 0 days.

(21) Appl. No.: 09/449,902

(22) Filed: Nov. 30, 1999

Related U.S. Application Data

(60) Provisional application No. 60/110,418, filed on Nov. 30, 1998.

(51) Int. Cl.[7] .............................................. H01L 31/0312
(52) U.S. Cl. ........................ 257/77; 257/761; 257/763; 257/768; 257/770
(58) Field of Search ........................ 257/77, 763, 768, 257/761, 770

(56) References Cited

U.S. PATENT DOCUMENTS 5,051,785 A  *  9/1991  Beetz, Jr. et al. ............... 357/4
5,389,799 A  *  2/1995  Uemoto ........................ 257/77

FOREIGN PATENT DOCUMENTS

| DE | 197 38 512 A1 | * | 2/1999 |
| JP | 5-24983 | * | 2/1993 |
| JP | 06183710 A | * | 7/1994 |

* cited by examiner

Primary Examiner—Nathan Flynn
Assistant Examiner—Ahmed J. Sefer
(74) Attorney, Agent, or Firm—Timothy P. Evans

(57) ABSTRACT

A new n-type semiconducting diamond is disclosed, which is doped with n-type dopant atoms. Such diamond is advantageously formed by chemical vapor deposition from a source gas mixture comprising a carbon source compound for the diamond, and a volatile hot wire filament for the n-type impurity species, so that the n-type impurity atoms are doped in the diamond during its formation. A corresponding chemical vapor deposition method of forming the n-type semiconducting diamond is disclosed. The n-type semiconducting diamond of the invention may be usefully employed in the formation of diamond-based transistor devices comprising pn diamond junctions, and in other microelectronic device applications.

7 Claims, 2 Drawing Sheets

N-TYPE DIAMOND AND METHOD FOR PRODUCING SAME

CROSS REFERENCE TO RELATED APPLICATIONS

The present application is related to provisional application Serial No. 60/110,418, filed Nov. 30, 1998, now abandoned, entitled "n-TYPE DIAMOND AND METHOD FOR PRODUCING SAME," from which priority is claimed under 35 USC §119(e).

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

1. Field of the Invention

This invention relates to methods for producing n-type semiconducting diamond, particularly such methods which utilize a chemical vapor deposition ("CVD") preparation of carbon to form a diamond structure wherein a deposition substrate is heated by a rhenium hot wire, and more particularly to semiconducting diamond materials having a uniformly distributed concentration of rhenium throughout.

An n-type semiconducting diamond is indispensable to the fabrication of semiconducting diamond devices which depend on a p-n junction for their successful operation. Several attempts have been made to dope diamond with impurities by the super-high pressure synthesis process or ion implantation but none has succeeded in synthesizing an n-type semiconducting diamond having low electrical resistivity and high electron mobility.

The present invention was developed to fill a need for a semiconducting diamond material having n-type conductivity. Semiconducting diamond has numerous attributes which are attractive for high-frequency, high-power semiconductor applications. These properties include a high electrical field breakdown voltage, elevated temperature stability, high electron and hole mobilities, high thermal conductivity, and excellent resistance to radiation.

2. Background Art

Semiconducting synthetic or natural diamonds are mostly prepared or found as p-type materials, with boron atoms being the most common impurity. M. W. Geiss. D. D. Rathman, D. J. Ehrlich. R. A. Murphy, W. T. Lindley, "High-Temperature Point-Contact Transistors and Schottky Diodes Formed on Synthetic Boron-Doped Diamond," IEEE Electron Device Letters, Vol. EDL-8, No. 8, (August 1987), pp. 341–343, discloses the formation of point-contact transistors on synthetic boron-doped diamond. The diamond used in formation of the point-contact transistor is a diamond single crystal produced using a high-temperature-high-pressure process. H. Shiomi, Y. Nishibayashi, N. Fujimore, "Electrical Characteristics of Metal Contacts to Boron-Doped Diamond Epitaxial Films," Japanese Journal of Applied Physics, Vol. 28, No. 5, (May 1989), pp.758–762, teaches the production of a planar field effect transistor device based on a diamond film. The device disclosed comprises a single crystal diamond substrate on which a single crystal epitaxial layer of boron doped diamond is deposited, thereby producing a p-type semiconductor layer. Titanium (Ti) source and drain contacts, as well as an aluminum (Al) gate Schottky contact are deposited on the diamond film. Type IIb diamonds are described, in A. S. Vishnevskil, A. G. Gontar, "Electrical Conductivity of Heavily Doped P-Type Diamond," Soviet Physics-Semiconductor, Vol. 15(6), (June 1981), pp. 659–661; A. S. Vishnevskil, A. G. Gontar, "Electrical Conductivity of Synthetic Diamond Crystals," Soviet Physics-Semiconductor, Vol. 11(1), (October 1977), pp.1186–1187; G. N. Bezrukov, L. S. Smrnimov, "Some Electrical and Optical Properties of Synthetic Semiconducting Diamonds Doped With Boron," Soviet Physics-Semiconductor, Vol. 4(4), (October 1970), pp. 587–590; J. J. Hauser, J. R. Patel, "Hopping Conductivity in C-Implanted Amorphous Diamond, or How to Ruin a Perfectly Good Diamond," Solid State Communications, Vol. 18, (1976), pp. 789–790; I. G. Austin, R. Wolfe, "Electrical and Optical Properties of a Semiconducting Diamond," Proc. Phys. Soc., (1956), pp. 329–338; P. T. Wedepohl, "Electrical and Optical Properties of Type IIb Diamonds," Proc. Phys. Soc., Vol. LXX, No. 2B, (1957), pp.177–185; A. T. Collins, A. W. S. Williams, "The Nature of the Acceptor Centre in Semiconducting Diamond," J. Phys. C: Solid St. Phys., Vol. 4, (1971), pp. 1789–1800; and V. S. Vavilov, "Ion Implantation into Diamond," Radiation Effects, Vol. 37, (1978), pp. 229–236.

Impurities such as lithium which produce n-type diamond have been incorporated into previously formed diamond crystal lattices by ion implantation methods. See U.S. Pat. No. 5,792,256 to Kucherov, et al., and "Electrical Properties of Diamond Doped by Implantation of Lithium Ions," V. S. Vavilov, E. A. Konorova, E. B. Stepanova, and E. M. Trukhan, Soviet Physics-Semiconductors, Vol. 13(6), (1979), pp.635–638. In the case of the former employs a nuclear transmutation technique to convert boron-10, previously incorporated into a carbon-12 matrix, to lithium-7 by bombardment with a high flux of thermal neutrons. The matrix is then converted to a diamond lattice by initiating a solid phase transformation in the carbon using high pressure and temperature.

The latter method produces thin layers of n-type diamond having lithium directly inserted by high energy implantation. The thickness of the layer is, therefore, limited by the energy of accelerated ions that are not infinite. Moreover, the incorporation of n-type impurities into diamond crystal lattices by ion implantation causes a severely damaged surface layer due to graphitization of the diamond which cannot be removed by annealing. Doping with lithium by this method to concentrations higher than $10^{15}/cm^3$ also leads to graphitization. The implanted crystal must then be heat treated to electronically activate the implanted impurity. The severely damaged layer resulting from ion implantation and the inhomogeneity and significant concentration gradients of the implanted ion across the implanted film thickness render the n-type diamond unsuitable for semiconductor applications.

Another method for producing n-type diamond involves the formation of p-type diamond thin film by adding a boron compound such as diborane to the raw material gas for microwave plasma chemical vapor deposition and then converting boron-10 to lithium-7 by neutron irradiation. However, the chemical vapor deposition method limits the depth of the semiconducting substrate to approximately 100 microns. Moreover, the material is unsuitable for semiconductor materials because of radioactive isotopes created during neutron irradiation.

Other attempts to make an n-type semiconducting diamond are described in V. S. Vavilov, E. A. Konorova, "Electric Properties of Diamond Doped by Implantation of Lithium", Soviet Physics-Semiconductors, Vol. 13(6), p.

635 (1979); in V. S. Vavilov, E. A. Konorova, "Conductivity of Diamond Doped by Implantation of Phosphorus Ions," Soviet Physics-Semiconductors, Vol. 9(8), (1976), pp. 962–964; in V. S. Vavilov, E. A. Konorova, "Implantation of Antimony Ions Into Diamond," Soviet Physics-Semiconductors, Vol. 6(12), (1972), pp. 1998–2002; in Jean-Francois Morhange, "Study of Defects Introduced by Ion Implantation in Diamond," Japanese Journal of Applied Physics, Vol. 14(4), (1975), pp. 544–548; in Tsai et al, "Diamond MESFET Using Ultrashallow RTP Boron Doping," IEEE Electron Device Letters, Vol. 12, No. 4, (April 1991), pp. 157–159; and in Gildenblat, et al., "High-Temperature Thin-Film Diamond Field-Effect Transistor Fabricated Using a Selective Growth Method," IEEE Electron Device Letters, Vol. 12, No. 2, (February 1991), pp. 37–39.

Finally, the art closest to the present invention is discussed in U.S. Pat. No. 5,051,785 to Beetz, Jr. et al., and U.S. Pat. No. 5,381,755 to Glesener, et al. In the former, a chemical vapor method for producing an n-type diamond semiconductor is described, wherein lithium, antimony, bismuth, arsenic, phosphorous, and scandium are used as doping ions. A chemical vapor deposition method is used to laid-down the carbon film. A methane/hydrogen gas mixture is flowed over a hot tungsten filament to heat and dissociate the carbon-containing gas. Beetz's n-type impurity, however, is introduced with the gas in order that the impurity be incorporated into the carbon lattice in situ. Beetz, Jr., et al., however, did not recognize that the hot filament itself could act as a source of n-type impurity material. The latter patent describes a method for growing a doped diamond film wherein a diamond carbon layer is deposited from a carbon containing gas mixture. As with Beetz, et al., however, Glesener, et al., does not recognize the efficacy of doping with a refractory filament wire.

Therefore, there remains a need to provide a more satisfactory solution for producing a robust, bulk diamond semiconductor material exhibiting n-type conductivity.

SUMMARY OF INVENTION

The present invention seeks to resolve at least some of the problems which have been experienced in the background art, as identified above.

Specifically, it is an object of this invention to provide an n-type semiconducting diamond and a process for producing the same.

It is still another object of the invention is to obtain an n-type semiconducting diamond rather than an implanted thin layer.

It has now been found that the above objects of the present invention can be attained by a semiconducting diamond comprising diamond carbon and rhenium.

A further object of the present invention is to obtain n-type semiconducting diamond having a uniformly distributed concentration of rhenium throughout the diamond lattice.

It is yet another object of this invention to provide a method for providing an n-type semiconducting diamond material.

Those skill in the art will appreciate that the objects of this invention constitutes an important advance in the art of n-type semiconducting diamond, as evidenced by the foregoing objects. Additional objects and advantages of the invention over the background art will become apparent from the description which follows, or may be realized by practicing the invention.

DETAILED DESCRIPTION OF THE INVENTION

Figure 1:
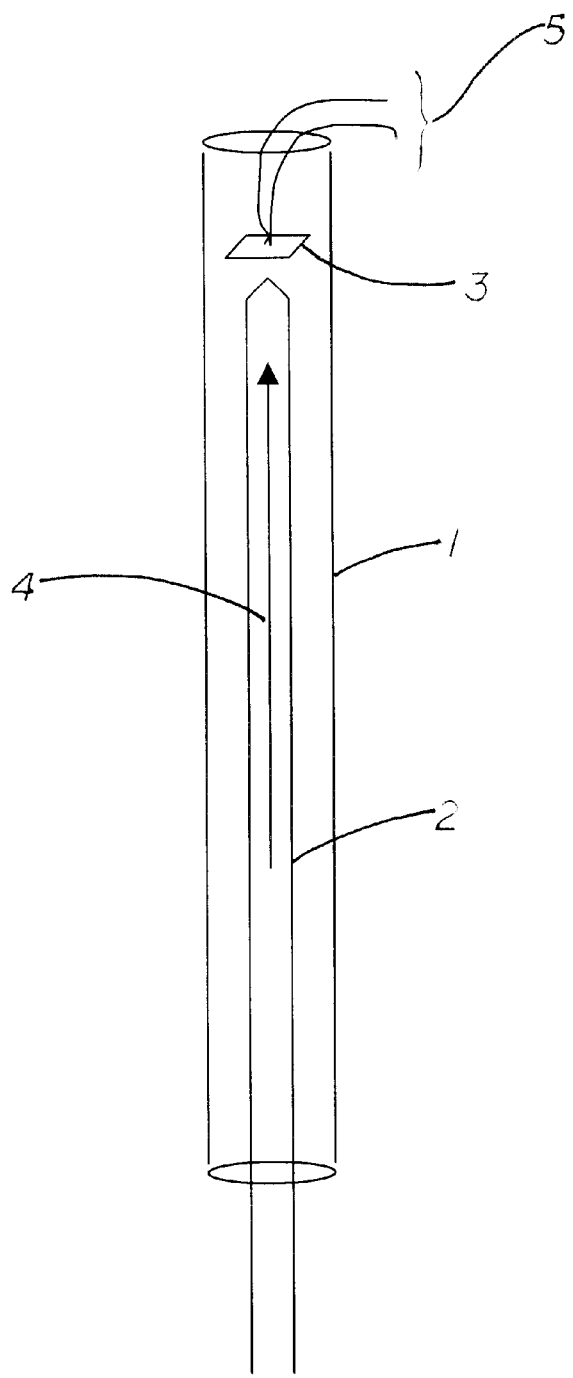
FIG. 1. Illustrates the experimental configuration for practicing the instant invention.

A polycrystalline diamond film exhibiting n-type electrical conduction has been synthesized by CVD in a hot filament reactor. The experimental setup for practicing the instant invention is illustrated in FIG. 1. Glass reactor 1 is a vertical, fused silica tube 38 mm in diameter. Within this tube a 0.010" rhenium wire filament (99.9% pure) 2 is resistively heated to 1950° C. (+/−50° C.) using a standard power supply and control circuitry (not shown). The flow of electricity through filament 2, in turn, heated a deposition substrate material 3. A gas 4 comprising a 0.5% mixture of methane ($CH_4$) in hydrogen ($H_2$) maintained at a total pressure of 20 torr and a flow rate of 100 sccm (standard cubic centimeters per minute) was introduced into glass reactor 1 in such a way as to pass hot wire filament 2 before encountering deposition substrate 3. The direction of the gas flow was vertical from top to bottom through glass reactor 1.

A 7 cm square piece of molybdenum foil (99.9% purity) was used as deposition substrate 3 to received the deposited diamond carbon. A thermocouple 5 (Type R 0.005" diameter, Pt/Pt-13%Rh) was attached to molybdenum substrate by spot welding the couple junction to the back side of the foil. In addition, substrate 3 was abraded lightly with 0.5 $\mu$-m diamond dust abrasive, then washed with methanol prior to CVD process deposition. The processed substrate 3 was then suspended above rhenium filament 2 by approximately 4 mm, and oriented with the flat face perpendicular to the gas flow. The temperature of substrate 3 was maintained at 870° C. (+/−20° C.) during growth of the film by moving substrate 3 relative to the hot filament 2.

The diamond carbon film was grown for a total of approximately 170.5 hours. When growth was terminated by interrupting current to filament 2, the film cracked into three main pieces probably due to thermal stresses built up during cooling. The deposited material, however, adhered to substrate 3 sufficiently for recovery.

In order to separate the deposited diamond film form substrate 3 the sample was subjected to the following chemical baths to remove the metal substrate and to clean the surfaces of the synthesized film fragments.

1) Treating the sample/substrate in boiling, freshly prepared aqua regia {15 cc concentrated hydrochloric acid and 5 cc concentrated nitric acid} for 15 minutes followed by thoroughly rinsing the sample fragments with deionized water. This step etches away the molybdenum substrate and any other metal contaminants.

2) Treating the sample fragments in a boiling solution of 10 cc concentrated, sulfuric acid, 10 cc 30% hydrogen peroxide, and 0.5 cc 48% hydrofluoric acid for 15 minutes and rinsing the samples in deionized water. This step is intended to eliminate any metal oxides and metal carbides.

3) Treating the cleaned fragments in a solution containing 10 cc concentrated sulfuric acid having 1 g. potassium nitrate dissolved therein and heated to a temperature of about 280° C. for 5 minutes followed again by rinsing the sample in deionized water. This treatment removes non-diamond carbon phases, such as graphite, from the surfaces of the deposited sample.

The resultant three major fragments were approximately 50 µm thick and irregularly shaped, about 2 mm by 6 mm. These fragments were heated to 550° C. for 24 hours in flowing, dry nitrogen to minimize residual subsurface hydrogen incorporated during growth.

Ion scattering analysis performed on one of the fragments showed a heavy metal surface concentration of $1.7 \times 10^{13}$ $cm^{-2}$ tungsten or rhenium (ion scattering could not distinguish between the two, however, because this sample was grown using a rhenium filament, we treat this as the rhenium content of the diamond film), or about 0.5%, which extrapolates into a bulk concentration of 350 ppm. Raman scattering confirmed that the film is diamond carbon.

Figure 2:
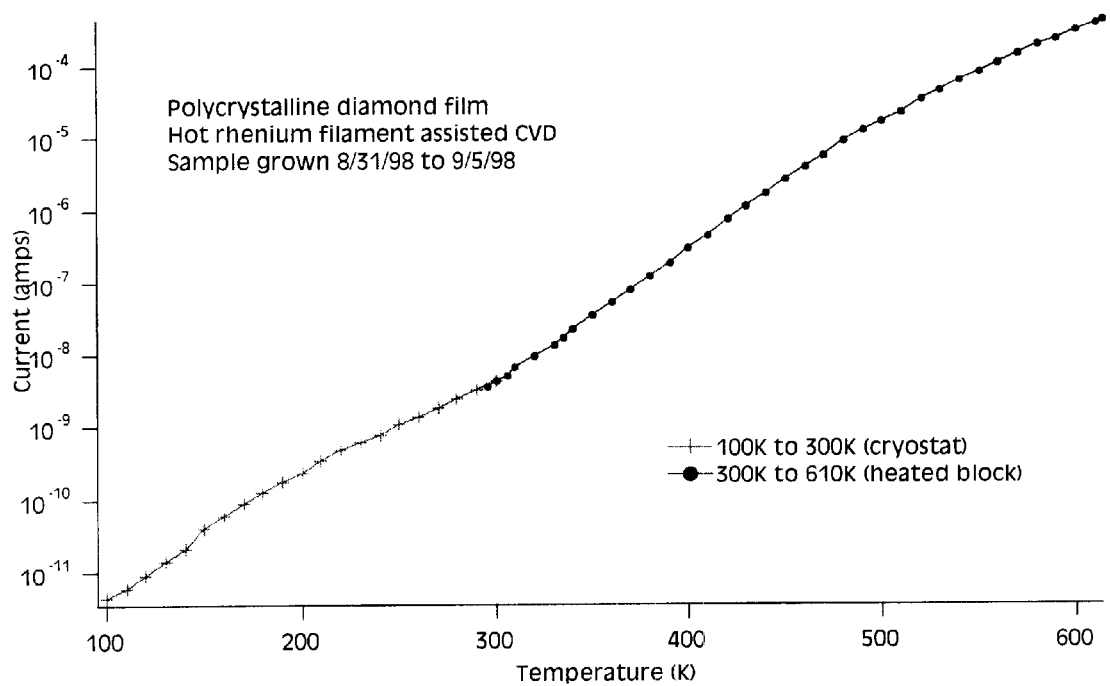
FIG. 2. Illustrates the temperature dependent current flow through the semiconductor of the present invention under the influence of a 20 volt bias potential applied across this device.

To determine the electrical characteristics of this film, one fragment was metallized through a mask to form two contacts on the growth side of the film, 0.070" squares 0.050" apart. 30 nm sputtered chromium was overlayed with 200 nm sputtered gold to form ohmic contacts. The current caused by the application of a 20 volt bias between these contacts was measured from 100° K to 610° K; the results are shown in FIG. 2, and indicate clearly that the sample acts as a semiconductor (that is, the current increases as the temperature increases). Finally, the sign of the charge carriers was measured using the thermoelectric effect. Contact to the gold pads was made by using pointed, spring-loaded, gold-plated probes which held the sample firmly against a 0.005" sapphire disc on an aluminum block. When either contact was heated by focusing 1.0 W of blue-green light from an argon ion laser onto it, the electrical potential of that contact fell to about −20 mV relative to the (nominally) room temperature contact. This is not a quantitative measure of the thermoelectric coefficient, but rather a measure of its sign. Since the sign is negative, the charge carriers of the semiconductor are negative. The incorporation of rhenium into the polycrystalline diamond film during growth, therefore, has rendered it an n-type semiconductor.

This approach to synthesis of n-type diamond differs greatly from current technology. The Applicant, however, does not wish to be unduly limited in his invention. While the foregoing description recites a single technique for growing a diamond carbon film other techniques would be equally suitable. These might include, but are not restricted to, microwave assisted CVD and ion beam epitaxy.

The technique described here, the specific incorporation of heavy transition metal elements into the diamond lattice to render the material an n-type semiconductor, has never been reported. It is noted that there is no current commercial technology for production of n-type diamond. Current research efforts have focussed on incorporation of nitrogen or phosphorus into the lattice, or diffusion of lithium into interstices. The former gives only deep donor material (0.5 eV ionization energy or greater), while the latter has failed because of the impenetrability of the diamond lattice. The approach described here produces n-type diamond whose ionization energy is less than 0.1 eV, a great improvement over existing research efforts.

What is claimed is:

1. An n-type semiconducting composition, comprising:
   carbon, said carbon having a diamond crystal structure; and
   a refractory metal solute homogeneously dispersed throughout said crystal structure such that the composition exhibits a bandgap ionization energy of about less than 0.2 eV.

2. The n-type semiconducting composition of claim 1, wherein the refractory solute metal is selected from the group of elements consisting of rhenium, tungsten, tantalum, molybdenum, niobium, and vanadium.

3. The n-type semiconducting composition of claim 1 wherein the refractory metal solute is present in said crystal structure at a concentration of at least about 350 ppm.

4. An n-type diamond semiconductor comprising carbon having a diamond crystal structure, and a refractory metal dopant uniformly dispersed throughout said having a diamond crystal structure, wherein the refractory metal comprises atoms having valence electrons in excess of said carbon valence electrons thereby donating free electrons and lowering of said diamond semiconductor bandgap ionization energy to less than about 0.2 eV.

5. The n-type diamond semiconductor of claim 4, wherein the refractory metal dopant is selected from the group of elements consisting of rhenium, tungsten, tantalum, molybdenum, niobium, and vanadium.

6. The n-type diamond semiconductor of claim 4, wherein the refractory metal dopant is present at a concentration of at least about 350 ppm.

7. The n-type diamond semiconductor of claim 4, wherein the semiconductor is a single crystal or is polycrystalline.

* * * * *